United States Patent
Koshiishi et al.

(10) Patent No.: US 6,733,624 B2
(45) Date of Patent: May 11, 2004

(54) APPARATUS FOR HOLDING AN OBJECT TO BE PROCESSED

(75) Inventors: Akira Koshiishi, Nirasaki (JP); Shinji Himori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/345,294

(22) Filed: Jan. 16, 2003

(65) Prior Publication Data

US 2003/0106647 A1 Jun. 12, 2003

Related U.S. Application Data

(63) Continuation of application No. PCT/JP01/06105, filed on Jul. 13, 2001.

(30) Foreign Application Priority Data

Jul. 17, 2000 (JP) ........................................ 2000-216552

(51) Int. Cl.⁷ ........................ H01L 21/302; C23C 16/50
(52) U.S. Cl. .................. 156/915; 156/345.51; 118/728; 118/500; 361/234
(58) Field of Search ........................... 156/915, 345.51; 118/715–730

(56) References Cited

U.S. PATENT DOCUMENTS 5,790,365 A * 8/1998 Shel ........................... 361/234
5,958,265 A * 9/1999 Ogahara ................. 219/121.43

FOREIGN PATENT DOCUMENTS

| JP | 7-310187 | 11/1995 | |
| JP | 07310187 A | * 11/1995 | ........... C23C/16/50 |
| JP | 10303288 A | * 11/1998 | ........... H01L/21/68 |
| JP | 2000-36490 | 2/2000 | |

* cited by examiner

Primary Examiner—Gregory Mills
Assistant Examiner—Ram N Kackar
(74) Attorney, Agent, or Firm—Oblon, Spivak, McClelland, Maier & Neustadt, P.C.

(57) ABSTRACT

An apparatus for holding an object to be processed, according to this invention is mounted in a plasma processing apparatus and includes a convex-shaped holder main body, first dielectric film, and second dielectric film. The holder main body has a holding portion which holds an object to be processed placed on it and a flange formed on the peripheral portion of the holding portion to fit with a focus ring. The first dielectric film attracts the object to be processed placed on the holding portion to the holder main body by a Coulomb force. The second dielectric film attracts the focus ring fitted on the flange to the holder main body by an attracting force larger than that of the first dielectric film using a Johnson-Rahbek force. The electrostatic attracting force of the focus ring for the holder main body is increased, so that the cooling effect is increased. A change in plasma processing characteristics over time in the vicinity of the focus ring can be eliminated, and the entire surface of the object to be processed can be processed uniformly.

13 Claims, 2 Drawing Sheets

APPARATUS FOR HOLDING AN OBJECT TO BE PROCESSED

CROSS-REFERENCE TO RELATED APPLICATIONS

This is a Continuation Application of PCT Application No. PCT/JP01/06105, filed Jul. 13, 2001, which was not published under PCT Article 21(2) in English.

This application is based upon, and claims the benefit of priority from, the prior Japanese Patent Application No. 2000-216552, filed Jul. 17, 2000, the entire contents of which are incorporated herein by reference.

BACKGROUND OF THE INVENTION

1. Field of the Invention

The present invention relates to an object-holding apparatus mounted in the process chamber of a plasma processing apparatus or the like to hold an object to be processed.

2. Description of the Related Art

Generally, as an apparatus for processing a substrate to be processed such as a semiconductor wafer with a plasma, for example, a CVD apparatus, an etching apparatus and the like, and an ashing apparatus and the like for removing a resist mask are known widely.

This plasma processing apparatus has a process chamber where plasma is generated in a process gas-introduced atmosphere so as to process a loaded substrate to be processed. A holding apparatus for holding the substrate to be processed while functioning as an electrode for generating the plasma is set in the process chamber.

FIG. 5 shows an arrangement of a conventional holding apparatus.

This holding apparatus is formed of a susceptor (holder main body) 1 on which a semiconductor wafer (to be referred to as a wafer hereinafter) W as an object to be processed is to be placed, an electrostatic chuck 2 arranged on the upper surface (the upper surface of a convex portion) of the holder main body 1, and a focus ring 3 fitted on a flange surrounding the electrostatic chuck 2. The upper surface of the focus ring 3 has a groove (step) to fit with the placed wafer W.

The holder main body 1 has a gas supply path 6 through which a gas is introduced from the outside to control the temperature of the wafer W. The gas supply path 6 is formed of a trunk portion 6a connected to an external gas supply source (not shown) and branch portions 6b branching from the trunk portion 6a and extending through the electrostatic chuck 2 to connect to a plurality of openings 7 formed in the upper surface of the electrostatic chuck 2.

The gas supply source supplies helium gas or the like that serves as a heat transfer medium (cooling medium) to control the temperature of the held wafer. An RF power supply 4 is connected to the holder main body 1 to supply RF power to it. The electrostatic chuck 2 is formed as a sheet-like dielectric made of a polyimide resin or the like. An electrode plate 8 connected to a DC power supply 5 is formed in the electrostatic chuck 2. When the DC power supply 5 applies a DC voltage to the electrode plate 8, an attracting force such as the Coulomb force is generated and the wafer W is electrostatically attracted to the holder main body 1.

Usually, in the process with the plasma processing apparatus, the wafer W is attracted to the electrostatic chuck 2 and held by it. The process chamber is evacuated by an exhaust system (not shown) to a predetermined vacuum degree, and a process gas is introduced there. After that, the RF power supply 4 applies RF power to the holder main body 1 so the holder main body 1 serves as an electrode, thus generating a plasma between the holder main body 1 and an opposing electrode (not shown). The plasma converges on the wafer W through the focus ring 3 on the holder main body 1, and subjects the wafer W to a predetermined plasma process (e.g., an etching process). This process of exposing the wafer to the plasma increases the temperature of the wafer W. When the helium gas (described above) is sprayed to the lower surface of the wafer W through the openings 7, the wafer W can be cooled efficiently.

In this holding apparatus, however, the focus ring 3 is merely fitted on the holder main body 1 considering maintenance and the like. A narrow vacuum gap is present between the focus ring 3 and holder main body 1 to degrade heat transfer between them, and they cannot be cooled well like the wafer W. Hence, as the process of the wafer W progresses, the temperature of the focus ring 3 is stored over time, and exceeds the temperature of the wafer W.

Due to this adverse influence, the etching characteristics of the peripheral portion of the wafer W change to etch this portion insufficiently. Then, for example, the hole-making readiness may be degraded, or the etching selectivity may be decreased. The hole-making readiness mean the characteristics indicating whether etching to a predetermined depth can be performed reliably. If the hole-making readiness is poor, that is, a contact hole, for example, cannot be made by etching to a predetermined depth.

Particularly, these days, increases in diameter and micropatterning degree of the wafer W are strongly demanded in order to increase the production amount and to improve the packing density. Also, a high yield standard is also demanded. Devices are arranged on the wafer W until very close to its circumference, so that a layout with which the number of chips that can be formed per wafer W can be increased as much as possible can be obtained. As a result, the temperature increase of the focus ring 3 largely adversely affects the yield of the devices.

As means for solving this problem, Jpn. Pat. Appln. KOKAI Publication Nos. 7-310187 and 10-303288 (U.S. Pat. No. 5,958,265) propose various methods that adjust the temperature of a member corresponding to the focus ring.

Of these references, Jpn. Pat. Appln. KOKAI Publication No. 10-303288 discloses a technique of attracting a focus ring (character correction ring) by electrostatic attraction to improve the contact, so that heat conduction is improved and the focus ring cooling effect is increased. In this prior art, however, the focus ring has a complicated shape, and it is cumbersome to form it. A thin portion such as a flange tends to deform when heat expansion or contraction acts on it. When this deformation occurs, the contact with the cooling surface degrades, to sometimes hinder cooling.

Regarding electrostatic attraction of the focus ring and the wafer W, attraction and release are performed simultaneously by one power supply. Thus, when the wafer W is to be loaded on or removed from the electrode, the focus ring sometimes floats. When the focus ring floats to come into contact with the transfer mechanism, a transfer error may occur. In view of this, this prior art has a mechanical clamp mechanism. Thus, the focus ring is urged against the holder main body further tightly, so that the cooling effect is obtained, and floating can be prevented. However, the mechanical mechanism has a driving mechanism and a detachable connecting mechanism such as a clamper.

Accordingly, the mechanical mechanism has a complicated structure. This increases the cost.

BRIEF SUMMARY OF THE INVENTION

It is an object of the present invention to provide an object-holding mechanism which is mounted in an apparatus that processes an object to be processed with a plasma, suppresses heat accumulation, and eliminates a change in plasma processing characteristics over time in the vicinity of a focus ring, so that the entire surface of the object to be processed can be processed uniformly, and cost reduction can be realized with a simple structure.

In order to achieve the above object, the present invention provides an object-holding apparatus comprising a holder main body which internally includes a temperature adjusting mechanism and forms a convex shape, and has a holding portion on an upper surface of a convex portion where an object to be processed is to be placed and a flange formed on a peripheral portion of the holding portion in order to fit with a focus ring, a first dielectric film which is formed on the holding portion and generates a Coulomb force for attracting the object to be processed upon application of a DC voltage, a second dielectric film which is formed on the flange and generates a Johnson-Rahbek force for attracting the focus ring upon application of a DC voltage, and a DC power supply which applies DC voltages to the first and second dielectric films, wherein the temperature adjusting mechanism adjusts the focus ring and the object to be processed held by the holding portion to almost the same temperature.

An object-holding apparatus has a holder main body which internally includes a temperature adjusting mechanism and forms a convex shape, and has a holding portion on an upper surface of a convex portion where an object to be processed is to be placed and a flange formed on a peripheral portion of the holding portion where a focus ring is to be fitted, a first dielectric film which is formed on the holding portion and generates a Coulomb force for attracting the object to be processed upon application of a DC voltage, a second dielectric film which is formed on the flange and generates a Johnson-Rahbek force for attracting the focus ring upon application of a DC voltage, a DC power supply which applies DC voltages to the first and second dielectric films, and a switch which is formed between the first dielectric film and the DC power supply and is electrically connected when the object to be processed is to be processed and electrically disconnected when the object to be processed is to be transferred, wherein the focus ring is attracted and held when the object to be processed is to be transferred as well.

DETAILED DESCRIPTION OF THE INVENTION

The embodiments of the present invention will be described in detail with reference to the drawings.

Figure 1:
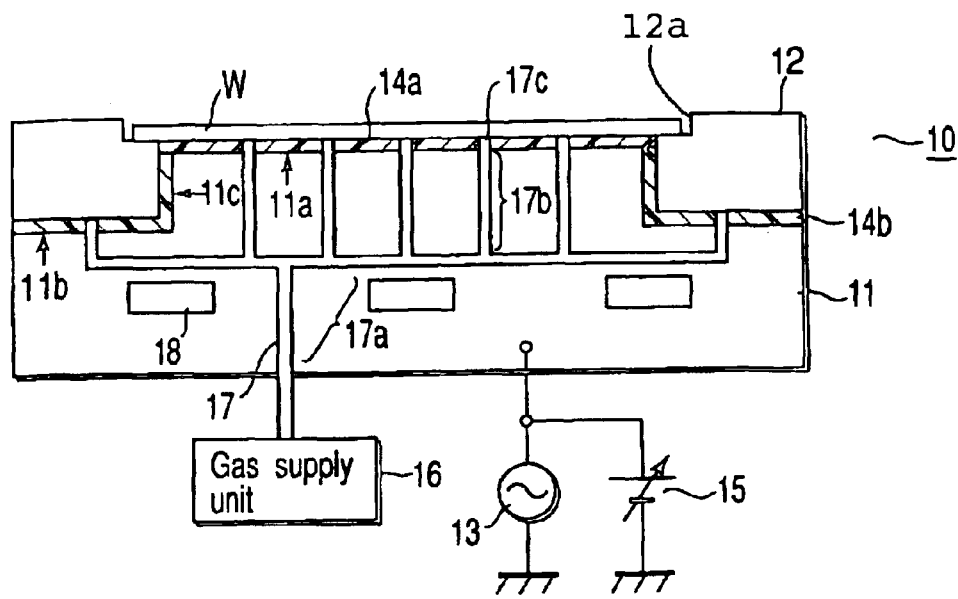
FIG. 1 is a sectional view of an arrangement of an object-holding apparatus according to the first embodiment of the present invention.

FIG. 1 shows a sectional view of an object-holding apparatus according to the first embodiment of the present invention, to explain this apparatus.

This object-holding apparatus 10 is formed of a convex holder main body 11 where a semiconductor wafer (to be referred to as a wafer hereinafter) W serving as an object to be processed is transferred and placed by a transfer mechanism (not shown), a first dielectric film 14a formed to cover a wafer placing surface (holding portion) 11a on the upper surface of the convex portion of the holder main body 11, a second dielectric film 14b formed to cover a convex portion side wall surface 11c and a focus ring placing surface (flange) 11b which is on the peripheral portion of the convex portion of the holder main body 11, and a focus ring 12 to be detachably fitted on the flange 11b.

The holder main body 11 is connected to an RF power supply 13 which supplies RF power of, e.g., 13.56 MHz, and a DC power supply 15 which outputs a DC voltage in order to generate an electrostatic attracting force (to be described later). The output from the DC power supply 15 can be adjusted. The holder main body 11 is made of an insulating material, e.g., AlN or $Al_2O_3$. The focus ring 12 is made of silicon, silicon nitride, or ceramic material such as silicon carbide. The holder main body 11 may be in tight contact with a lower electrode (not shown), so that RF power or DC power may be supplied to it through the lower electrode.

The first dielectric film 14a and second dielectric film 14b are made of inorganic materials, e.g., ceramic materials, or dielectrics, e.g., heat-resistant resins such as polyimide resins, which have different resistivities. The first and second dielectric films 14a and 14b are formed by the ceramic spray coating technique to thicknesses of, e.g., about 600 μm, and serve as an electrostatic chuck that electrostatically chucks the wafer W and focus ring 12.

For example, the first and second dielectric films 14a and 14b are both made of mixtures obtained by adding conductive impurities to alumina, and their resistivities can be appropriately adjusted by the contents of the conductive impurities to be added. Regarding the thicknesses of the first and second dielectric films 14a and 14b, the smaller, the lower the dielectric breakdown; the larger, the lower the attracting force. Thus, the thicknesses are appropriately set in accordance with the wafer W and focus ring 12.

For example, in order to cause a dielectric film with a film thickness d and a dielectric constant $\in$ to serve as an electrostatic chuck, if a DC voltage V is applied to the dielectric film from its one side, positive and negative charges of $Q = \in V/d$ per unit area are accumulated on the two sides of the dielectric film. These charges form a Coulomb force or the like to attract the wafer W and focus ring 12 through the dielectric film. If, however, the dielectric film is made of a material with a resistivity lower than $1 \times 10^{12}$ Ω.cm, a small current flows through it, and the charges are accumulated on its surface. As a result, an apparent d becomes very small, and a strong attracting force can be obtained. This is known as an electrostatic chuck utilizing a Johnson-Rahbek force.

According to this embodiment, for example, the first dielectric film 14a is made of a material with a resistivity larger than $1 \times 10^{12}$ Ω.cm (e.g., a mixture obtained by adding a conductive impurity to alumina), so that the semiconductor wafer W is attracted by the Coulomb force. When attracting the semiconductor wafer W, spontaneous charge emission is faster than the strong attracting force. Hence, quick loading and unloading of the semiconductor wafer W can have a higher priority.

For example, the second dielectric film 14b is made of a material with a resistivity smaller than $1 \times 10^{12}$ Ω.cm (e.g., a mixture obtained by adding a conductive impurity such as TiO to alumina), so that the semiconductor wafer W is attracted by the Johnson-Rahbek force. When attracting the focus ring 12, as the focus ring 12 has a thickness of, e.g., about 6 mm, an attracting force with a long duration has a priority over quick spontaneous charge emission. Therefore, spontaneous emission of the accumulated charges after application of the DC voltage is stopped lasts longer with the Johnson-Rahbek force than with the Coulomb force.

A stepped portion 12a is formed on the upper surface of the focus ring 12 along its inner circumference. The stepped portion 12a is formed to have such a step (depth) that it becomes almost flush with the surface of the first dielectric film 14a when the focus ring 12 is attached to the holder main body 11. Thus, the lower surface of the wafer W fitted in this step can come into tight contact with the first dielectric film 14a.

When the DC power supply 15 applies an arbitrarily set DC voltage of, e.g., 2 kV, to the holder main body 11, the surfaces of the first and second dielectric films 14a and 14b are electrostatically charged to generate an electrostatic attracting force. The first dielectric film 14a attracts the wafer W with the Coulomb force, and the second dielectric film 14b attracts the focus ring 12 with the Johnson-Rahbek force.

Two temperature-adjusting mechanisms are mounted in this object to be processed holding apparatus, and are both used for cooling. One is a mechanism that performs cooling with a fluid, and the other is a mechanism that performs cooling with a gas. More specifically, a refrigerant flow channel 18 is formed in the holder main body 11. A cooling medium (e.g., ethylene glycol) is supplied through the refrigerant flow channel 18 to cool the wafer W indirectly through the holder main body 11. A gas supply path 17 is also formed in the holder main body 11. The gas supply path 17 introduces a gas from an external gas supply unit 16 to control the temperature of the wafer W. The gas supply path 17 is formed of a trunk portion 17a, and branch portions 17b branching from the trunk portion 17a and extending through the first and second dielectric films 14a and 14b to connect to a plurality of openings 17c formed in the upper surfaces of the first and second dielectric films 14a and 14b. In this arrangement, a temperature-controlled cooling gas, e.g., helium (He) gas, from the gas supply unit 16 is sprayed to the lower surface of the wafer W and the bottom surface of the focus ring through the gas supply path 17, to cool them.

Holding operation will be described through a case wherein the object to be processed holding apparatus with this arrangement is mounted in a plasma processing apparatus (etching apparatus).

Assume that the object to be processed holding apparatus is attached on the lower one of the upper and lower electrodes that are arranged in the process chamber to be parallel to each other. Also assume that RF power is applied to the object to be processed holding apparatus through the lower electrode, and that a DC voltage is applied to it directly, or through the lower electrode.

A wafer is loaded by a transfer mechanism from the outside and placed on the wafer-placing surface (the first dielectric film 14a of the holding portion 11a). After that, the DC power supply 15 applies a predetermined DC voltage to the holder main body 11, to electrostatically charge the first and second dielectric films 14a and 14b. The wafer W is electrostatically attracted onto the holding portion 12a by the Coulomb force generated by the first dielectric film 14a due to this charging, and is held there. Simultaneously, the focus ring 12 is also strongly electrostatically attracted onto the flange 11b by the Johnson-Rahbek force generated by the second dielectric film 14. The gate valve of the process chamber is closed, and the interior of the process chamber is set in a hermetic state. After that, the interior of the process chamber is pressure-reduced by evacuation with an exhaust system to a predetermined vacuum degree.

Subsequently, a process gas is introduced into the process chamber to form a process gas atmosphere. The RF power supply 13 applies RF power to the holder main body 11 to generate plasma. This plasma converges on the semiconductor wafer W on the holder main body 11 by the focus ring 12 of the holder main body 11, and subjects the surface of the semiconductor wafer W to a predetermined etching process.

At this time, as the wafer W is exposed to the plasma, its temperature increases. The refrigerant of the temperature-controlled refrigerant flow channel 18 cools the holder main body 11, to cool the wafer W on the holder main body 11. In addition, a cooling gas is sprayed to the wafer from the lower surface to cool it efficiently, thereby controlling the temperature of the wafer W. Meanwhile, the focus ring 12 is also exposed to the plasma, so its temperature increases. In the same manner as the wafer W, the focus ring 12 is also efficiently cooled by the refrigerant of the refrigerant flow channel 18 and the cooling gas of the gas supply path 17, and is maintained at substantially the same temperature level as that of the wafer W. Substantially no temperature difference occurs between the focus ring 12 and wafer W, or is very small even if it does.

Therefore, the peripheral portion of the wafer W is not adversely affected by the temperature of the focus ring 12, and a constant etching process can be performed on the entire surface of the semiconductor wafer W. The hole-making readiness may not degrade, or the etching selectivity may not degrade, unlike in the conventional case.

As described above, according to this embodiment, the focus ring 12 is strongly attracted to the holder main body 11 by the Johnson-Rahbek force generated by the second dielectric film 14b, and is efficiently cooled by the refrigerant of the refrigerant flow channel 18 and the cooling gas of the gas supply path 17, so it is maintained to have no temperature difference from the wafer W. Hence, degradation of the etching characteristics at the peripheral portion of the semiconductor wafer W is prevented, and the semiconductor wafer W can be uniformly etched at its peripheral portion in the same manner as its central side. This can increase the yield.

Figure 2A:
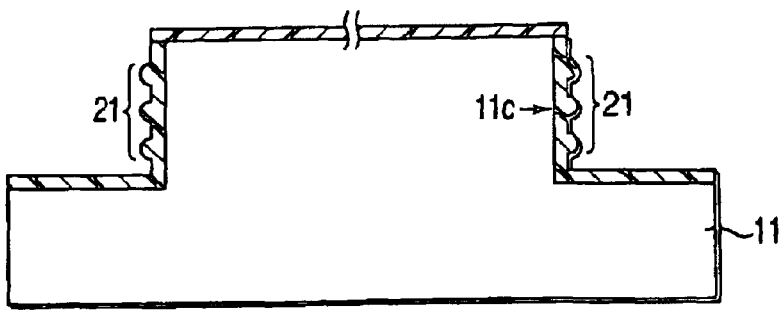
FIGS. 2A and 2B are views showing modifications to the first embodiment.
Figure 2B:
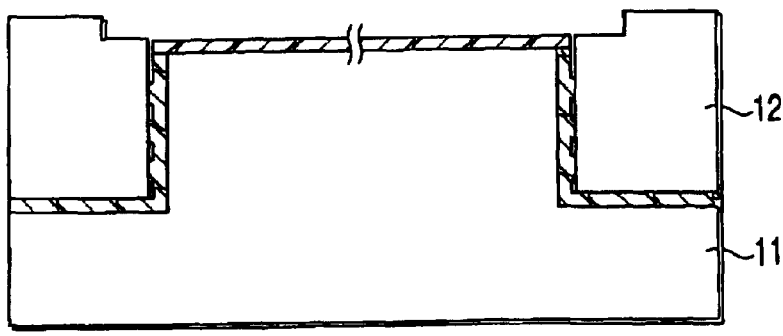

FIGS. 2A and 2B show modifications to the first embodiment.

FIGS. 2A and 2B show only characteristic portions, and except for them, the arrangement is the same as that of the arrangement shown in FIG. 1.

In the object-holding apparatus, or the embodiment described above, the first and second dielectric films 14a and 14b are made of ceramic materials, but they may be made of heat-resistant resins such as a polyimide resin or an ethylene tetrafluoride resin. When forming dielectric films by using such resins, a ring-like stopper 21 is formed on the convex portion side wall surface 11c of the holder main body 1, as shown in FIGS. 2A and 2B, and the focus ring 12 is fitted on it. This can suppress floating when no power is supplied. In this example, the three-step ring-like stopper 21 is not limited to this.

In this embodiment as well, regarding the electrostatic attracting method, for the wafer W, the Coulomb force with good releasing properties is employed. For the focus ring, the Johnson-Rahbek force having a strong attracting force that does not allow release easily is employed. Floating of the focus ring when supply from the DC power supply is stopped is suppressed with a simple arrangement. As a result, a transfer error does not occur easily.

Figure 3:
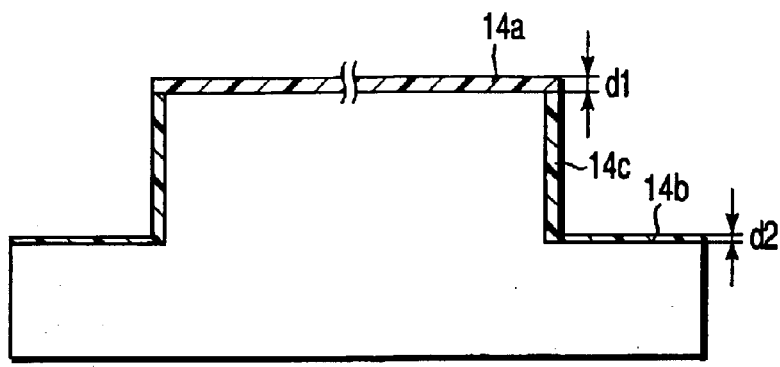
FIG. 3 is a sectional view of an arrangement of an object-holding apparatus according to the second embodiment of the present invention.

FIG. 3 shows a sectional view of an object-holding apparatus according to the second embodiment of the invention, and explain this apparatus. FIG. 3 shows only characteristic portions, and except for them, the arrangement is the same as that shown in FIG. 1.

The arrangement of this object-holding apparatus is almost the same as that of the first embodiment described above, but the first and second dielectric films are different.

Usually, to cause the dielectric films to have different electrostatic attracting forces, the dielectric films may be formed by using materials with different dielectric constants. When the dielectric constant is the same, a relationship that the smaller the thickness, the higher the attracting force, but the lower the dielectric breakdown, and conversely the larger the thickness, the larger the dielectric breakdown, but the lower the attracting force, as described above, may be utilized.

According to this embodiment, by using dielectric films having the same dielectric constant, a thickness d2 of a second dielectric film 14b that holds the focus ring is formed smaller than a thickness d1 of a first dielectric film 14a which holds a wafer W. With this arrangement, the attracting force for holding the focus ring is set larger than the attracting force for the wafer W. A dielectric film 14c on a side wall surface 11c of a holder main body 1 may be rubbed when attaching and detaching a focus ring 12 for maintenance. Therefore, the dielectric film 14c is formed thick in view of the durability.

According to this embodiment, in the same manner as in the first embodiment described above, the focus ring is attracted to the holder main body, and is cooled efficiently. The focus ring can thus be maintained to have no temperature difference from the wafer W. Degradation in etching characteristics can be prevented, and the yield can be increased.

Figure 4:
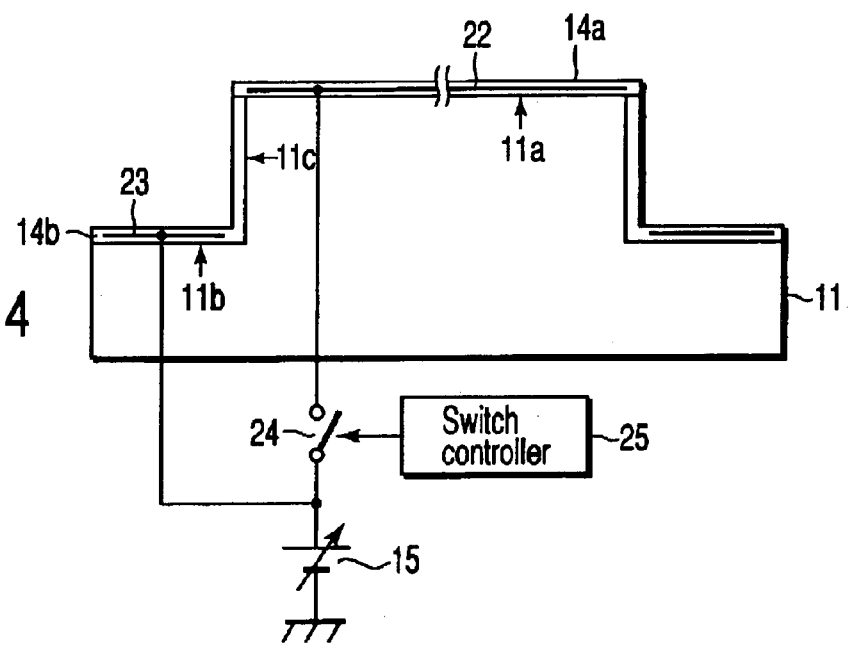
FIG. 4 is a sectional view of an arrangement of an object-holding apparatus according to the third embodiment of the present invention.
Figure 5:
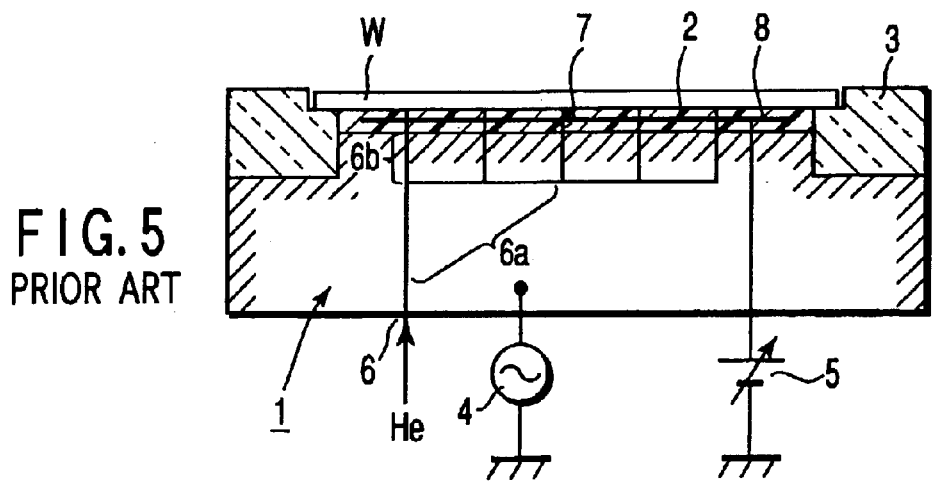
FIG. 5 is a sectional view of an arrangement of a conventional object-holding apparatus.

FIG. 4 shows a sectional view of an arrangement of an object-holding apparatus according to the third embodiment of the present invention, and explain this apparatus. FIG. 4 shows only characteristic portions, and except for them, the arrangement is the same as that shown in FIG. 1.

A wafer attracting electrode 22 is formed in a first dielectric film 14a formed to cover a wafer placing surface (holding portion) 11a of a holder main body 11. A focus ring attracting electrode 23 is formed in a second dielectric film 14b formed to cover a focus ring placing surface (flange) 11b. The wafer-attracting electrode 22 is connected to a DC power supply 15 through a switch 24. The focus ring-attracting electrode 23 is connected to the DC power supply 15 directly.

This switch 24 is switched by a switch controller 25 to control the wafer attracting state. More specifically, while a wafer W is being processed, the switch 24 is ON to apply a DC voltage to the wafer-attracting electrode 22, and the wafer W is held by the wafer placing surface 11a with electrostatic attraction. While the wafer W is being transferred, the switch 24 is OFF to stop application of the DC voltage to the wafer-attracting electrode 22, so that the wafer W can be released. A DC voltage is applied to the focus ring-attracting electrode 23 from the DC power supply 15 directly. The focus ring-attracting electrode 23 is not interlocked with the motion of the switch 24.

Therefore, when the wafer W is to be processed, DC voltages are applied to the wafer attracting electrode 22 and focus ring attracting electrode 23 to hold the wafer W and a focus ring 12 respectively. When the wafer W is to be transferred, the focus ring 12 can be kept attracted.

When different DC voltages are to be applied to the wafer-attracting electrode 22 and focus ring attracting electrode 23 in order to change the attracting force, a resistor may be connected between the switch 24 and wafer attracting electrode 22, and the DC voltages may be dropped by it. DC power supplies that can output independent voltages may be connected to the respective electrodes. Alternatively, the dielectric films may have different thicknesses, as in the second embodiment described above.

As has been described above, with the object-holding apparatus according to the present invention, the electrostatic attracting force of the focus ring for the holder main body is increased with a simple structure, so that the cooling effect is increased. A change in plasma processing characteristics over time in the vicinity of the focus ring can be eliminated, and the entire surface of the object to be processed can be processed uniformly. Floating of the focus ring during transfer of the wafer W can be prevented, so a transfer error can be prevented. In the embodiments described above, a semiconductor wafer is employed as an object to be processed. The present invention is not limited to this, but can be easily applied to an apparatus that holds an LCD substrate or the like.

What is claimed is:

1. An apparatus for holding an object to be processed, comprising:

a holder main body which has a placing surface where an object to be processed is to be placed on a holding portion of the placing surface, a focus ring which is arranged over a peripheral portion of the placing surface of the holder main body, first electrostatic attracting means, formed on the placing surface of the holder main body, for attracting the object to be processed, and second electrostatic attracting means, for attracting the focus ring with an electrostatic force larger than that of the first electrostatic attracting means.

2. An apparatus according to claim 1, wherein each of the first and second electrostatic attracting means comprises:

a dielectric film which covers upper surfaces of the holding portion and the peripheral portion, and a power supply which supplies an electrostatic force to the dielectric film.

3. An apparatus according to claim 2, wherein the dielectric film comprises a ceramic material.

4. The apparatus of claim 1, wherein:

said first electrostatic attracting means comprises a first dielectric film which is formed on the holding portion and generates a Coulomb force for attracting the object to be processed, and said second electrostatic attracting means comprises a second dielectric film which is formed on the peripheral portion and generates a Johnson-Rahbek force for attracting the focus ring, and the second dielectric film is located between the focus ring and the peripheral portion.

5. An apparatus according to claim 4, wherein the first and second dielectric films each comprise one material selected from a ceramic material and heat-resistant resins including a polyimide resin and an ethylene tetrafluoride resin.

6. An apparatus according to claim 4, wherein a portion of the second dielectric film, which is formed on an outer side wall of the holding portion connected from the upper surface of the holding portion where the object to be processed is to be placed to the flange, has a stopper formed of an annular convex portion.

7. An apparatus according to claim 4, wherein the temperature adjusting mechanism comprises:

a fluid cooling mechanism which has a refrigerant flow channel formed in the holder main body and supplies a cooling medium formed of a fluid through the refrigerant flow channel, to cool the object to be processed and the focus ring indirectly, and a gas cooling mechanism which has a gas supply path formed in the holder main body and supplies a cooling medium formed of a gas through the gas supply path, to cool the object to be processed and the focus ring by spraying the gas to lower surfaces of the object to be processed and the focus ring.

8. An apparatus according to claim 4, further comprising:

a DC power supply which applies DC voltages to the first and second dielectric films, and a switch which is formed between the first dielectric film and the DC power supply and is electrically connected when the object to be processed is to be processed and electrically disconnected when the object to be processed is to be transferred.

9. An apparatus according to claim 4, wherein the holder main body forms a convex shape, and has the holding portion on an upper surface of a convex portion, and the peripheral portion formed on a flange of the convex shape.

10. An apparatus according to claim 9, wherein a portion of the second dielectric film is formed on an outer side wall of the holding portion connected from the upper surface of the convex portion to the flange.

11. The apparatus of claim 1, wherein said first electrostatic attracting means comprises a first dielectric film which is formed on the holding portion;

said second electrostatic attracting means comprises a second dielectric film which is formed on the peripheral portion, wherein the first dielectric film is made of a material with a resistivity larger than $1 \times 10^{12} \Omega.m$, and the second dielectric film is made of a material with a resistivity smaller than $1 \times 10^{12} \Omega.m$.

12. An apparatus according to claim 1 wherein the first electrostatic attracting means has a first dielectric film and the second electrostatic attracting means has a second dielectric film, the second dielectric film is formed of a material having a higher dielectric constant than that of the first dielectric film.

13. An apparatus according to claim 1, wherein the first electrostatic attracting means has a first dielectric film and the second electrostatic attracting means has a second dielectric film, at least a power supply supplies an electrostatic force to the first and second film, and the second dielectric film has a thickness smaller than that of the first dielectric film.

* * * * *